(12) United States Patent  
Marimuthu et al.

(10) Patent No.: US 9,053,773 B2
(45) Date of Patent: Jun. 9, 2015

(54) METHOD AND APPARATUS FOR CLOCK POWER SAVING IN MULTIPORT LATCH ARRAYS

(71) Applicant: QUALCOMM Incorporated, San Diego, CA (US)

(72) Inventors: Saravanan Marimuthu, Bangalore KRN (IN); Sachin Bapat, Bangalore KRN (IN); Sakthivel Packirisamy, Bangalore KRN (IN)

(73) Assignee: QUALCOMM Incorporated, San Diego, CA (US)

( * ) Notice: Subject to any disclaimer, the term of this patent is extended or adjusted under 35 U.S.C. 154(b) by 84 days.

(21) Appl. No.: 14/025,741

(22) Filed: Sep. 12, 2013

(65) Prior Publication Data

US 2014/0177344 A1    Jun. 26, 2014

Related U.S. Application Data

(60) Provisional application No. 61/746,073, filed on Dec. 26, 2012.

(51) Int. Cl.

| | |
|---|---|
| *G11C 7/10* | (2006.01) |
| *G11C 7/00* | (2006.01) |
| *G11C 7/08* | (2006.01) |
| *G11C 8/16* | (2006.01) |

(Continued)

(52) U.S. Cl.
CPC ............ *G11C 8/16* (2013.01); *Y10T 29/49117* (2015.01); *G11C 7/00* (2013.01); *G11C 29/818* (2013.01); *G11C 7/10* (2013.01); *G11C 5/06* (2013.01); *G11C 7/222* (2013.01); *G11C 8/18* (2013.01); *G11C 7/1057* (2013.01); *G11C 7/1075* (2013.01); *G11C 2207/108* (2013.01)

(58) Field of Classification Search
CPC ............ G11C 7/10; G11C 7/222; G11C 8/16; G11C 8/18; G11C 29/818; G11C 5/06; G11C 7/00
USPC ................. 365/189.02, 230.05, 51, 63, 191, 365/189.04, 233.1
See application file for complete search history.

(56) References Cited

U.S. PATENT DOCUMENTS

| | | |
|---|---|---|
| 6,208,165 B1 | 3/2001 | Haruki |
| 6,566,720 B2 | 5/2003 | Aldrich |

(Continued)

FOREIGN PATENT DOCUMENTS

JP        H09191052 A    7/1997

*Primary Examiner* — Ly D Pham
(74) *Attorney, Agent, or Firm* — Loza & Loza LLP (57) ABSTRACT

An integrated circuit element is disclosed having a memory device; a P-type semiconductor region including a first semiconductor device from a first memory port circuit coupled to the memory device and configured to enable access to the memory device when the first semiconductor device is activated; an N-type semiconductor region including a second semiconductor device from a second memory port circuit coupled to the memory device and configured to enable access to the memory device when the second semiconductor device is activated; and a plurality of signal lines distributed over the P-type and N-type semiconductor regions including a first memory port selection line coupled to allow the first semiconductor device to be activated; a second memory port selection line coupled to allow the second semiconductor device to be activated; and a clock signal line placed between the first memory port selection line and the second memory port selection line.

28 Claims, 8 Drawing Sheets

(51) Int. Cl.
  *G11C 8/00* (2006.01)
  *G11C 8/12* (2006.01)
  *G11C 8/18* (2006.01)
  *G11C 29/00* (2006.01)
  *G11C 5/06* (2006.01)
  *G11C 7/22* (2006.01)

(56) References Cited

U.S. PATENT DOCUMENTS

2004/0140483 A1 7/2004 Yonemaru
2009/0167394 A1 7/2009 Bosshart

METHOD AND APPARATUS FOR CLOCK POWER SAVING IN MULTIPORT LATCH ARRAYS

CROSS-REFERENCE TO RELATED APPLICATIONS

This application claims priority to and the benefit of U.S. provisional patent application No. 61/746,073, filed in the United States Patent and Trademark Office on Dec. 26, 2012, the entire content of which is incorporated herein by reference.

BACKGROUND

1. Technical Field

The following relates generally to power saving for integrated circuits, and more specifically to a method and apparatus for clock power saving in multiport latch arrays.

2. Background

In semiconductor design, standard cell methodology is an approach of designing integrated circuits (ICs) such as application-specific integrated circuits (ASICs) using abstract logic representations to create low-level, very-large-scale integration (VLSI) layouts. Each abstract logic representation is implemented with a group of transistor and interconnect structures as a standard cell. For example, Boolean logic functions such as AND, OR, XOR, XNOR, and NOR functions may be implemented using standard cells. In addition to these basic Boolean logic functions, more complex logic functions may be implemented as standard cells, as well as storage functions such as flip-flop or latch storage cells.

Standard cells makes it possible for one designer to focus on high-level aspects of digital design, such as creating various results using logic functions, while another designer may focus on specific aspects of implementation, such as circuit layout and optimization. Standard cell methodology, along with constant improvements in semiconductor manufacturing techniques, has provided chip designers with the ability to scale ASICs from comparatively simple, single-function ICs implemented with several thousand gates to complex, multi-million-plus gate system-on-a-chip (SoC) devices.

Regardless of design complexity, logic circuits require a timing source to operate. Typically, a clock circuit may be used to generate timing signals that are distributed to all devices in the logic circuit over a timing source distribution network referred to as a clock net. The timing signal is composed of a signal that consists of alternating ones and zeros, generated by a switching of the clock circuit. The clock circuit must drive the timing signal over the clock net, which means the clock circuit must constantly change the state of the timing signal from ones-to-zeros, and zeros-to-ones by charging and discharging the clock net, respectively The cycling of charging/discharging operations requires expenditure of power referred to as clock switching power, and clock switching power is one of the major power dissipation sources in all ASIC implementations because a clock circuit is constantly running.

The amount of power expended to cycle, or charge/discharge, a clock net is proportional to a resistance of the clock net to change, as well as a frequency of the charge/discharge cycle, as shown in the following formula:

Power=$CV^2 f$, where C is a load capacitance of the clock net, V is the voltage to charge the load capacitance, and f is the operational frequency of the clock net. Thus, one component of the change resistance of the clock net is due to the capacitance of the clock net, which includes coupling capacitance. Each device that is coupled to the clock net contributes to coupling capacitance. Increased coupling capacitance of the clock net will result in an increase in clock switching power consumption. Conversely, decreasing coupling capacitance of the clock net will result in a decrease of the clock switching power. Because operating frequencies for devices are only likely to increase in newer designs, and the voltage levels at which these devices may be operated are unlikely to be reduced much further for the immediate future, the ability to decrease coupling capacitance in the clock net is becoming critical in improving clock switching efficiency.

In the case of designs utilizing standard cells, a change in efficiency for a particular standard cell may have a multiplied impact because the particular standard cell may be used numerous times. Therefore, it would desirable to improve the efficiency of the design of standard cells as well as any circuit elements therein.

BRIEF DESCRIPTION OF THE DRAWINGS

These and other sample aspects of the disclosure will be described in the detailed description that follow, and in the accompanying drawings, wherein.

In accordance with common practice, some of the drawings may be simplified for clarity. Thus, the drawings may not depict all of the elements of a given apparatus (e.g., device) or method. Finally, like reference numerals may be used to denote like features throughout the specification and figures.

SUMMARY

The following presents a simplified summary of one or more aspects of the disclosed approach, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

An integrated circuit element is disclosed having a memory device; a P-type semiconductor region including a first semiconductor device from a first memory port circuit coupled to the memory device, the first semiconductor device configured to enable the first memory port circuit to provide access to the memory device when the first semiconductor device is activated; an N-type semiconductor region including a second semiconductor device from a second memory port circuit coupled to the memory device, the second semiconductor device configured to enable the second memory port circuit to provide access to the memory device when the second semiconductor device is activated; and a plurality of signal lines distributed over the P-type and N-type semiconductor regions. The plurality of signal lines including a first memory port selection line coupled to allow the first semiconductor device to be activated; a second memory port selection line coupled to allow the second semiconductor device to be activated; and a clock signal line placed between the first memory port selection line and the second memory port selection line.

In another aspect, the disclosure provides an apparatus that includes an integrated circuit element having a means for storing data and a P-type semiconductor region. The P-type semiconductor region includes a first semiconductor means from a first memory port circuit coupled to the means for storing data, the first semiconductor means configured to enable the first memory-port circuit to provide access to the means for storing data when the first semiconductor means is activated. The integrated circuit element also includes a second semiconductor means from a second memory port circuit coupled to the means for storing data, the second semiconductor means configured to enable the second memory-port circuit to provide access to the means for storing data when the second semiconductor means is activated. The integrated circuit element further includes means for distributing signals over the P-type and N-type semiconductor regions of the IC element. The means for distributing signals includes a first memory port selection means for activating the first semiconductor means; a second memory port selection means for activating the second semiconductor means; and a clock signal distribution means for providing timing information to the IC element, the clock signal distribution means being placed between the first memory port selection means and the second memory port selection means.

Still another aspect of the disclosed approach provides a method for forming a memory apparatus including arranging a set of integrated circuit (IC) elements, where each IC element includes a memory device. The memory device includes a first memory port circuit having a first memory port enable node coupled to a first semiconductor device configured to enable access to the content of the memory device, wherein the first memory port enable node is located in a P-type semiconductor region. The memory device also includes a second memory port circuit having a second memory port enable node coupled to a second semiconductor device configured to enable access to the content of the memory device, wherein the second memory port enable node is located in an N-type semiconductor region. The method further includes routing a first memory port selection signal line in the P-type semiconductor region to connect the first memory port enable node of at least two first memory port circuits; routing a second memory port selection signal line in the N-type semiconductor region to connect the second memory port enable node of at least two second memory port circuits; and routing a clock signal line to connect the set of IC elements, wherein the clock signal line is positioned between the first memory port selection signal line and the second memory port selection signal line.

These and other aspects of the disclosed approach will become more fully understood upon a review of the detailed description, which follows.

DETAILED DESCRIPTION

In the following description, reference is made to the accompanying drawings in which is shown, by way of illustration, one or more specific approaches in which various aspects of the disclosure may be practiced. Any detailed description of a specific approach is not to be taken in a limiting sense, and the scope of the disclosure is defined only by the appended claims. The description contained herein is intended to describe various aspects of the disclosure in sufficient detail to enable those of ordinary skill in the art to practice the claimed scope of the disclosure. Other approaches may be utilized and changes may be made to the disclosed approach without departing from the spirit of the disclosure.

Further, in the following description elements may be described and illustrated in block diagram form in order not to obscure the disclosed approach due to the inclusion of unnecessary detail. Although any delineation or partitioning of logic between various blocks in a block diagram is to be understood to be of a specific implementation, unless specified otherwise herein, any specific implementation shown and described should only be construed as an example and should not be construed as the only way to implement the disclosed approach. Thus, it should be readily apparent to one of ordinary skill in the art that the disclosed approach may be practiced using numerous other delineation or partitioning of logic between various blocks.

One or more of the elements described herein and illustrated in the drawings may be rearranged, combined into a single element, and/or embodied in several elements. These elements may also be referred to herein as modules, circuits, units, components, acts, features, steps, and/or functions. Additional elements may also be included to describe and illustrate, but without departing from the spirit of, the various aspects of the disclosed approach. For example, any element described herein may include multiple instances of that element. These elements may be generically indicated by a numerical designator (e.g., "110"), and specifically indicated by the numerical indicator followed by either an alphabetic designator (e.g., "110*a*" or "110A") or a numeric indicator proceeded by a "dash" (e.g., "110-1"). For ease of following the description, element number indicators will for the most part begin with the number of the figure in which the elements are introduced or most fully discussed.

The following description includes examples in order to provide those of ordinary skill in the art with a better understanding of various aspects of the disclosed approach, and is not meant to be limiting of the scope, applicability, or configuration set forth in the claims. Thus, changes may be made in the function and arrangement of the elements discussed without departing from the spirit and limiting scope of the disclosure. Changes to various aspects of the disclosed approach may also omit, substitute, or add various procedures or components as appropriate, while still remaining within the scope of the disclosed approach. For instance, various steps may be added, omitted, combined, and/or even changed in their order during a particular performance of any of the methods described herein. Also, features described with respect to certain aspects may be combined in other aspects.

Latch elements are very important devices that are often used in designs such as latch arrays for memory devices. As such, all cell libraries provided by integrated circuit device manufacturers include a latch element implemented as a standard cell. In standard cell methodology, all basic elements are realized as cells with fixed dimensions to facilitate the process of automated digital layout. For example, each basic element may be implemented as a fixed-height, variable-width full-custom cell to allow placement in rows during device design. The use of standard cells offers a level of predictability during the design process because timing and power issues may be pre-determined for each standard cell. Furthermore, it is easier, and more efficient, to construct large scale designs of repeating elements than having to account for specific characteristics of different elements. Although a particular design may achieve some space efficiency by using standard cells, it should be obvious that minimization of physical space needed for each type of standard cell is a critical requirement and, depending on the basic element being implemented, may significantly increase implementation complexity.

A latch array typically includes a finite number of latches, with each latch storing a unique bit. A multiport latch array provides such functions as multiple read ports and may be implemented with standard cells. For example, a 16×128 latch array may be implemented with multiple rows of standard cells. Because of its complexity, the multiport latch array typically has very congested routing, with metal layers necessary to route signals and interconnect devices that are fully occupied. Further, because of the standardized nature of the design of basic elements, placement of various elements and interconnects are necessarily fixed.

Figure 1:
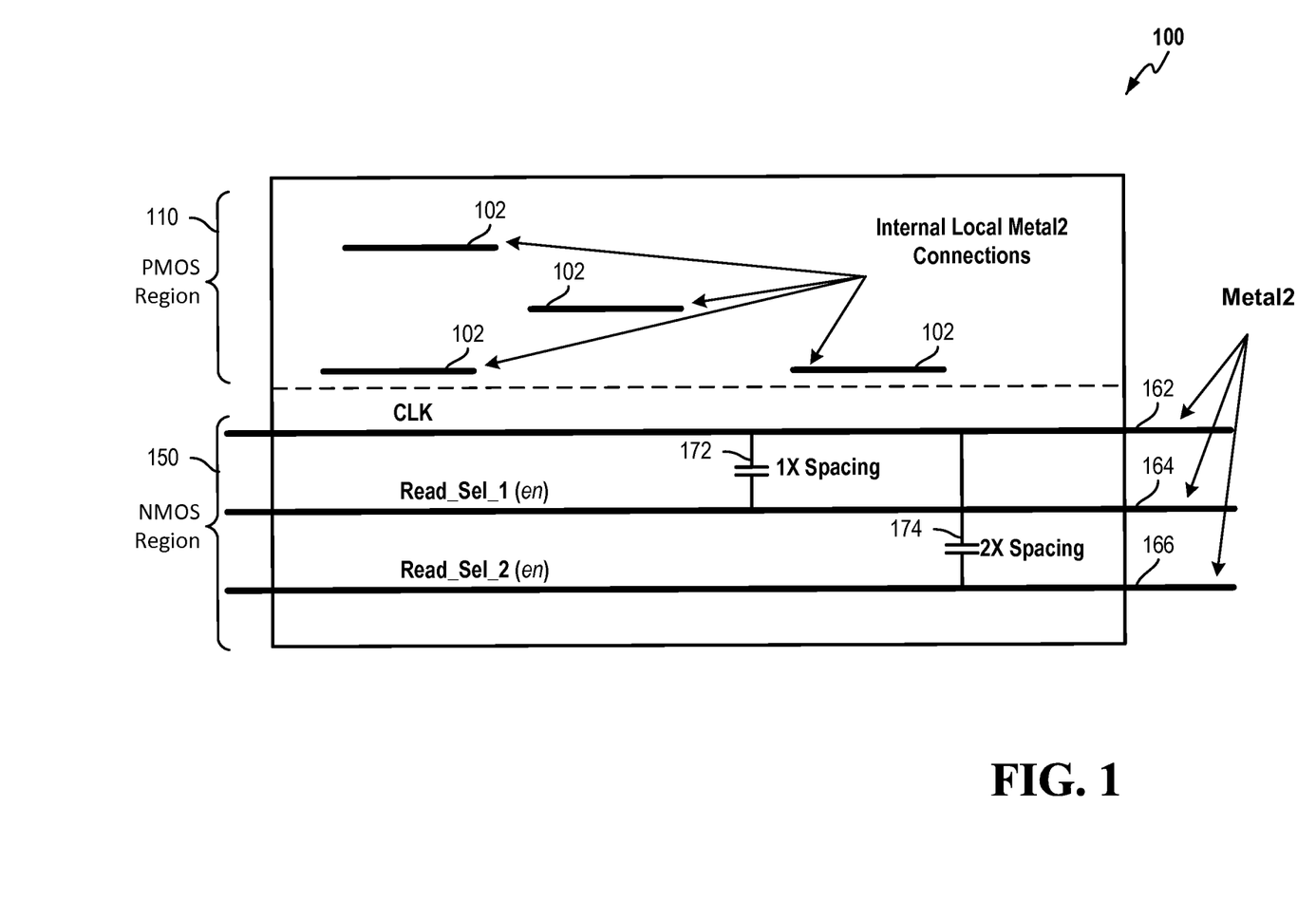
FIG. 1 is a plan view of a metal layer configuration of a conventional standard cell for a dual read port latch for implementing a multiport register.

FIG. 1 illustrates a plurality of metal layers in a conventional standard cell 100 for a dual port register flip-flop that may be used in implementing a memory device such as a multiport register. The conventional standard cell 100 has a predetermined height with multiple tracks. A memory device such as a 4×64 register may be implemented using four (4) rows, each row having sixty-four (64) of these standard cells. The conventional standard cell 100 includes a plurality of internal Metal2 connections 102 in a P-type metal-oxide-semiconductor (PMOS) region 110. The conventional standard cell 100 also includes an N-type MOS (NMOS) region 150 where first and second read port selection signal lines, respectively denoted in FIG. 1 as a Read_Sel__1 signal line 164 and a Read_Sel__2 signal line 166, are routed over two Metal2 global nets. The conventional standard cell 100 also provides a write port (not shown) that may be controlled using a CLK signal line 162. The Read_Sel__1 signal line 164 and the Read_Sel__2 signal line 166 are routed next to the CLK signal line 162. The CLK signal line 162, the Read_Sel__1 signal line 164 and the Read_Sel__2 signal line 166 are routed using separate Metal2 global nets. In the example as shown in FIG. 1, a run length for each of the Metal2 global nets may be approximately 200 μm-400 μm in length.

Figure 2:
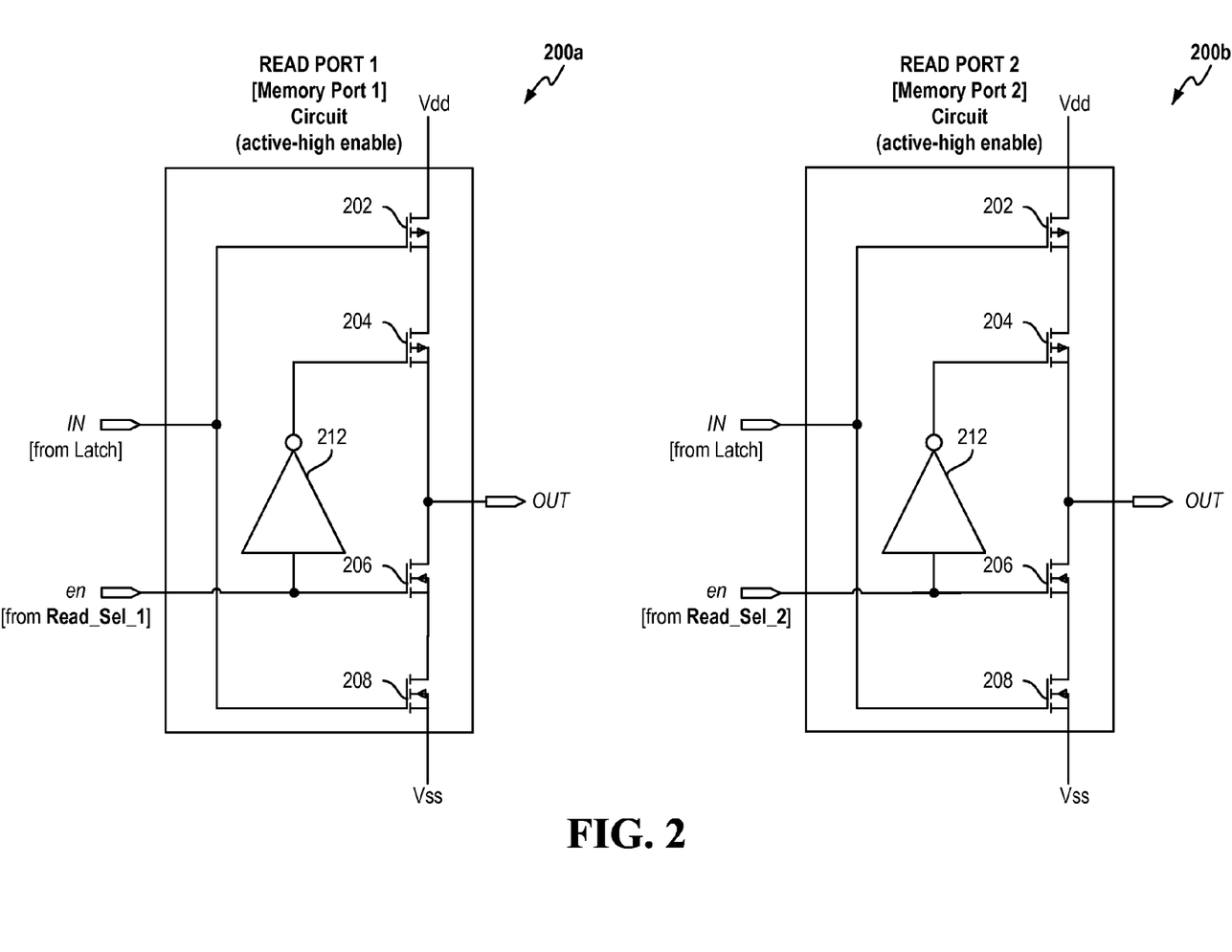
FIG. 2 is a circuit diagram of a conventional configuration of read port circuits of the dual read port latch of FIG. 1.

FIG. 2 illustrates two read port circuits for a pair of first and second read ports of a memory device, denoted as a Read_Port__1 circuit 200a and a Read_Port__2 circuit 200b, respectively, both of which are identical. Each of the read port circuits includes an inverter 212 coupled to a tri-state driver circuit formed by a pair of PMOS transistors 202, 204, and a pair of NMOS transistors 206, 208. An enable (en) input of the Read_Port__1 circuit 200a is coupled to the Read_Sel__1 signal line 164 in the NMOS region 150 such that the enable (en) input is tied directly to the gate of the NMOS transistor 206. Similarly, an enable (en) input of the Read_Port__2 circuit 200b is coupled to the Read_Sel__2 signal line 166 in the NMOS region 150 because the enable (en) input is tied directly to the gate of the NMOS transistor 206. The inverter 212 receives an enable (en) signal that controls a coupling of an input (IN) node and an output (OUT) node of the read port circuit. Thus, each of the read port circuits may be controlled by a respective read port selection signal line, where the read port circuits are active high-enable circuits.

An issue that may be seen in the conventional standard cell 100 illustrated in FIG. 1 is that the close proximate placement of the Metal2 global nets for the Read_Sel__1 signal line 164 and the Read_Sel__2 signal line 166 in relation to the CLK signal line 162 creates a capacitance effect referred to as clock coupling capacitance. Specifically, a first capacitor 172 is effectively created by the Metal2 global net that routes the Read_Sel__1 signal line 164 and the Metal2 global net that routes the CLK signal line 162; and a second capacitor 174 is effectively created by the Metal2 global net that routes the Read_Sel__2 signal line 166 and the Metal2 global net that routes the CLK signal line 162. As the capacitance value of any capacitor is inversely proportional to a square of the distance separating its electrodes, it can be seen that clock coupling capacitance value of the second capacitor 174 will be significantly less than the clock coupling capacitance value of the first capacitor 172. Regardless, the clock coupling capacitance due to the first capacitor 172 and the second capacitor 174 increases the amount of power at which a clock signal must be driven to achieve a desired performance.

One proposed solution is to move the Read_Sel__1 signal line 164 or the Read_Sel__2 signal line 166 to another Metal2 global net. However, because in the conventional standard cell 100 the Metal2 global nets for the Read_Sel__1 signal line 164 and the Read_Sel__2 signal line 166 are coupled directly to NMOS devices such as the transistor 206 in the NMOS region 150, neither the Read_Sel__1 signal line 164 nor the Read_Sel__2 signal line 166 may be moved to another Metal2 global net (i.e., another metal track) without a change to the circuitry because the positions of the PMOS region 110 and the NMOS region 150 are fixed.

Figure 3:
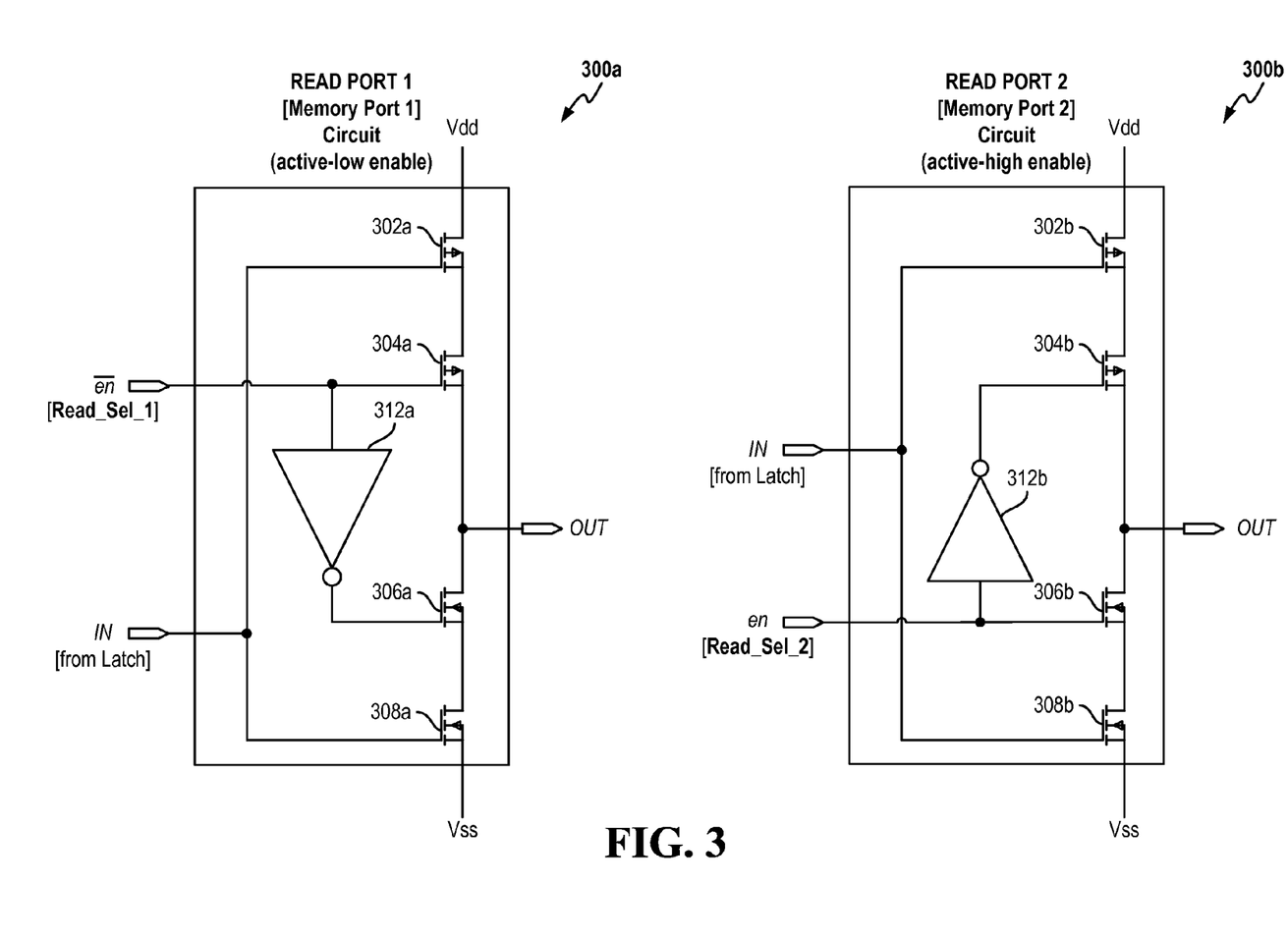
FIG. 3 is a circuit diagram of a complementary pair of read port output circuits for implementing dual read port output functionality of an improved dual read port latch for use with a multiport register as configured in accordance with one aspect of the disclosed approach for reducing clock power consumption.

FIG. 3 illustrates a multiplexing (MUX) access circuit-compatible approach that is provided herein for accessing multiport memory circuits such as multiport latches. In one aspect of the disclosed approach, an improved pair of memory port circuits configured to utilize opposing access enable signals may provide simultaneous memory access operations from a memory device while ameliorating the clock coupling capacitance issues. In one aspect of the disclosed approach, the MUX-compatible pair of memory port circuits for a multiport latch reduces undesirable capacitance formed by the Metal2 global net in routing the Read_Sel__1 signal line 164 and the Read_Sel__2 signal line 166; and the Metal2 global net in routing the CLK signal line 162. The pair of memory port circuits includes separate, complementary read port circuits denoted as a Read_Port__1 circuit 300a and a Read_Port__2 circuit 300b. Each of the read port circuits includes an inverter coupled to a tri-state driver circuit formed by a respective pair of PMOS transistors and a respective pair of NMOS transistors. Similar to the Read_Port__1 circuit 200a of FIG. 2, the Read_Port__2 circuit 300b of FIG. 3 is configured to provide an active high-enabled mode of operation. However, in one aspect of the disclosed approach, the Read_Port__1 circuit 300a of FIG. 3 includes an inverter 312a coupled to the transistors 304a and 306a to provide an active low-enable mode of operation.

Figure 4:
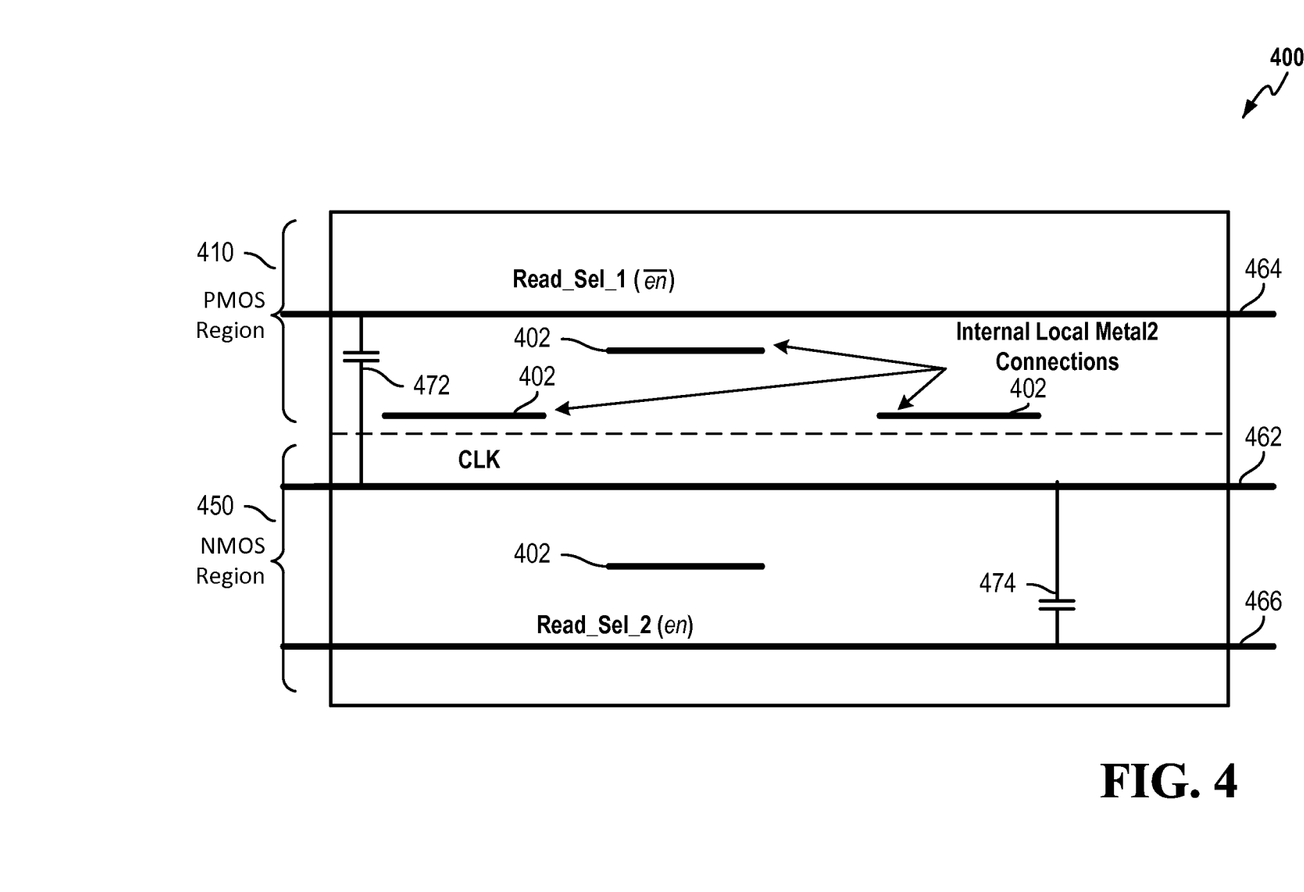
FIG. 4 is a plan view of a metal layer configuration of an improved standard cell that includes an improved dual read port latch architecture for implementing a multiport register configured in accordance with one aspect of a disclosed approach for reducing clock power consumption.

Referring also to FIG. 4, in one aspect of the disclosed approach the Read_Port__1 circuit 300a includes an active-low enable (en), or read enable, input node that is implemented in the PMOS region 410 of FIG. 4 and coupled to the gate of the transistor 304a. In contrast, the Read_Port__2 circuit 300b includes an active-high enable (en), or read enable, input node that is implemented in the NMOS region 450 and coupled to the gate of transistor 306b. The Read_Port__1 circuit 300a is controlled by a Read_Sel__1 signal line 464, which is coupled to its active-low enable (en) input node, and the Read_Port__2 circuit 300b is controlled by a Read_Sel__2 signal line 466, which is coupled to its active-high enable (en) input node. Specifically, when the transistor 304a is activated by a low enable signal received on the Read_Sel__1 signal line 464, the semiconductor device will enable the Read_Port__1 circuit 300a to provide an output on its OUT node based on the signal at its IN node, where the output of the read port circuit is an inverted version of the output from the latch. When the transistor 306b is activated by a high enable signal received on the Read_Sel__2 signal line 466, the semiconductor device will enable the Read_Port__2 circuit 300b to provide an output on its OUT node based on the signal at its IN node, where the output of the read port circuit is an inverted version of the output from the latch). A CLK signal line 462 is used to providing timing information to the memory device in which the improved pair of memory port circuits is implemented.

By implementing the Read_Port__1 circuit 300a such that access to its active-low enable (en) input node is placed in the PMOS region 410, the Read_Sel__1 signal line 464 may be carried by a Metal2 global net in the PMOS region 410 to activate the transistor 304a and thereby allow access through the Read_Port__1 circuit 300a to data stored in the latch to which the Read_Port__1 circuit 300a is coupled. Because this Metal2 global net is located in the PMOS region 410, it may be located further away from the other Metal2 global net (i.e., Read_Sel__2signal line 466) located in the NMOS region 450 and, more advantageously, further away from the CLK signal line 462. Thus, the Read_Port__1 circuit 300a and the Read_Port__2 circuit 300b may be used for servicing access operations for the latch with separate complementary MUX read circuits for each access operation with reduced clock coupling capacitance.

Because the Read_Port__1 circuit 300a provides an active low-enable tri-state MUX-compatible circuit for one read operation and the Read_Port__2 circuit 300b provides an active high-enable tri-state MUX-compatible circuit for the other read operation, there is some complexity that is introduced in needing to generate the additional inverse (i.e., active-low enable) read select signal for the Read_Port__1 circuit 300a in addition to the read select signal needed by the Read_Port__2 circuit 300b of the original design. Further, efficiency in the design and manufacturing stages may be reduced because implementation of the complementary read selection circuits reduces use of existing designs and standard cell methodologies based on those existing designs. However, deploying complementary read MUX-compatible circuits instead of replicating the standard read circuit will result in a reduction of clock coupling capacitance. This reduction in clock coupling capacitance further equates to a reduction in timing and power consumption. Thus, although complexity may be introduced into the design and manufacture of an interface for a multiport latch configured in accordance with various aspects of the approaches described herein, the resultant reduction in timing and power consumption may still be a highly desirable tradeoff to utilizing non-standard cell design elements. For example, reduction of clock coupling capacitance may result in reduction of timing of operations related to charging/discharging the clock lines to a particular level because there is less resistance thereto.

TABLE 1

Summary of Read Port Characteristics

| READ PORT CHARACTERISTIC | READ PORT 1 | READ PORT 2 |
| --- | --- | --- |
| Read Selection Signal Type | active low (en) | active-high (en) |
| Semiconductor Type | P-Type (PMOS) | N-Type (NMOS) |
| Controlled (activated) by | Read_Sel__1 | Read_Sel__2 |

Figure 5:
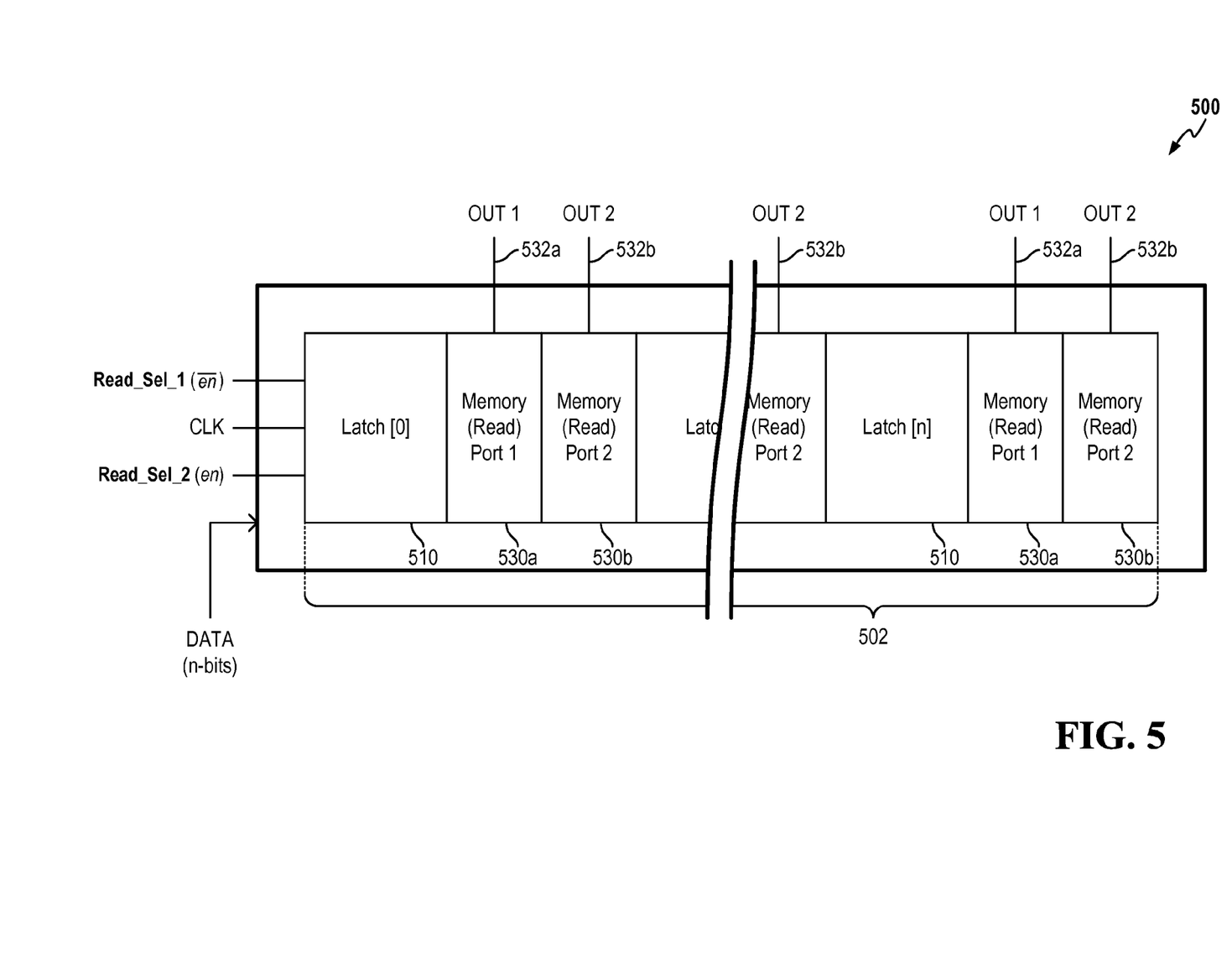
FIG. 5 is a block diagram of a multiport register in which various aspects of a disclosed approach for reducing clock power consumption may be described.
Figure 6:
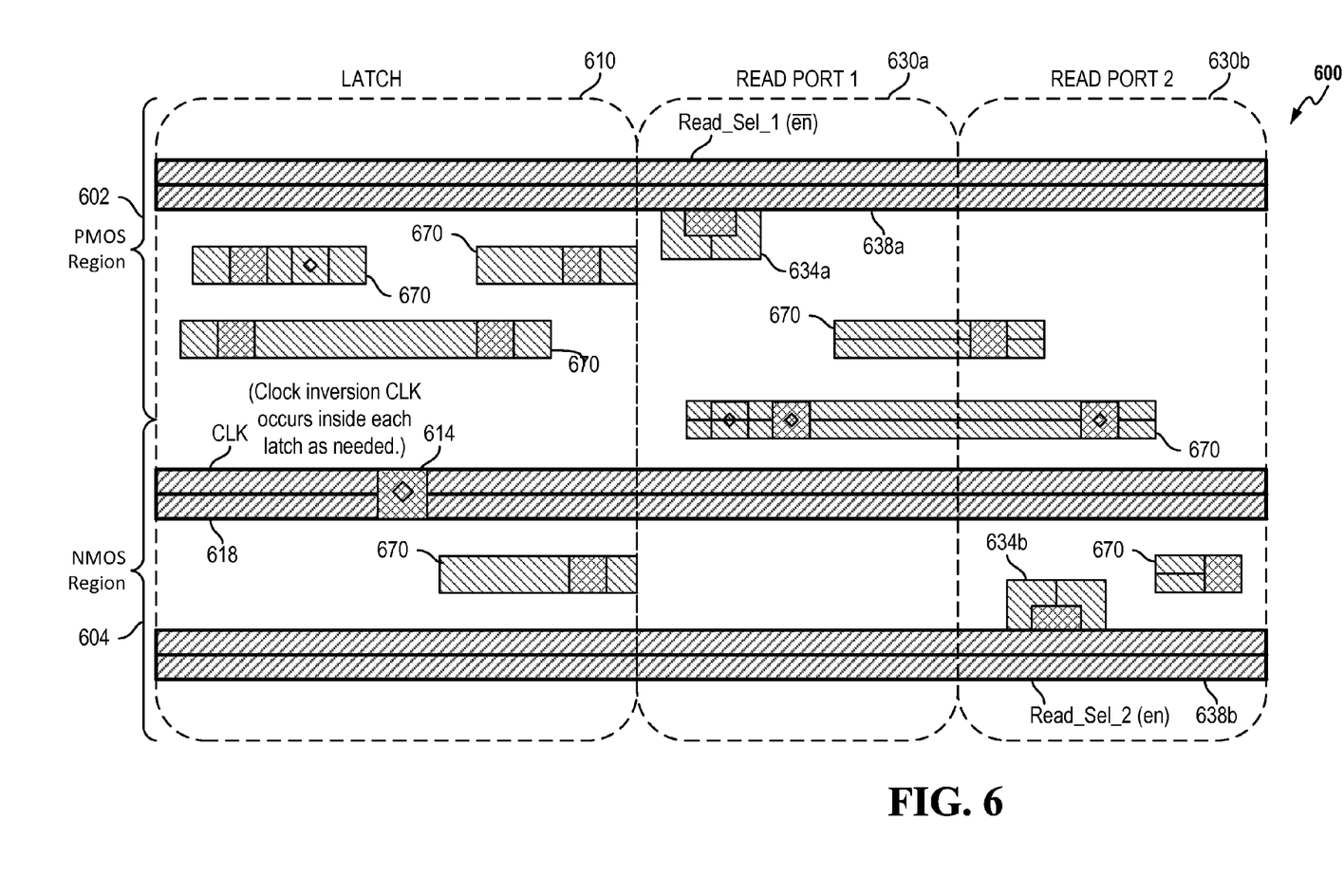
FIG. 6 is a plan view of a metal layer routing approach in a standard cell of an improved dual read port latch for implementing a multiport register configured in accordance with one aspect of a disclosed approach for reducing clock power consumption.

FIG. 5 illustrates a multiport register 500 that may be implemented using the improved dual read port circuits described herein and configured in accordance with various aspects of the disclosed approach for clock power saving. Reference will also be made to FIG. 6, which illustrates an improved dual read port latch as implemented in a standard cell 600. Although not shown, the latch circuit 510 may also be configured with one or more write ports to allow simultaneous read and write operations to the latch circuit 510. Thus, conceptually the multiport register 500 may be configured as a register that is capable of being read from and written to simultaneously on multiple ports. The multiport register 500 includes a plurality of dual memory (read) port latches 502 that each include a latch circuit 510, the contents of which may be coupled to (read out on) a first output 532a using a first memory (read) port circuit 530a, and also coupled to (read out on) a second output 532b using a second memory (read) port circuit 530b. For the remainder of the description, it may be assumed that the multiport register 500 is configured as a multiple read port register even as one of ordinary skill in the art would appreciate that the description would apply similarly if the multiport register 500 is configured as a multiple write port register. The latch circuit 510, the first read port circuit 530a, and the second read port circuit 530b, as well as the devices therein may be interconnected by various metal interconnects 670 as further shown in a latch portion 610, a first read port portion 630a, and a second read port portion 630b of the standard cell 600 of FIG. 6.

The multiport register 500 may include any number of dual read port latches to store a desired word size. For example, thirty-two (32) dual read port latches, each configured using a copy of the standard cell 600, may be used to implement a 32-bit register. In one aspect of the disclosed approach, because the dual read port latch shown in FIG. 6 is implemented in the standard cell 600, multiple copies may be placed end-to-end so that various signals may be passed from a right side of one standard cell to a left side of another standard cell. Global signal lines may be used to respectively route signals between circuits in respective portions of each dual read port latch in the plurality of dual read port latches 502. These circuits include the latch circuit 510 in the latch portion 610, the first read port circuit 530a in the first read port portion 630a, and the second read port circuit 530b in the second read port portion 630b. Specifically, in the illustrated example, each standard cell 600 includes a clock (CLK) signal line 618, a first read enable (Read_Sel__1) signal line 638a, and a second read enable (Read_Sel__2) signal line 638b that spans the standard cell 600, and each of these signal lines may be used to interconnect the plurality of dual read port latches 502. For example, the latch circuit 510 in the latch portion 610 may be attached to the clock signal line 618 using a clock contact 614 so that the latch circuit 510 may generate an inverted clock signal for use in operation of the latch circuit 510. In this way, the inverted clock signal does not have to be distributed as a global signal, saving space and avoiding other issues with having to route another signal line that may affect a variety of circuits.

As another example, the first read port circuit 530a in the first read port portion 630a may be attached to the first read enable signal line 638a using a first read port contact 634a. The first read port circuit 530a may then be enabled by the first read enable signal line 638a. Continuing with the example provided above, the first read port circuit 530a may be an active-low enable read port output circuit such as the Read_Port__1 circuit 300a in FIG. 3 and include the active-low enable (en) input node implemented in a PMOS region such as the PMOS region 410 of FIG. 4. In a similar fashion, the second read port circuit 530b in the second read port portion 630b may be attached to the second read enable signal line 638b using a second read port contact 634b. The second read port circuit 530b may then be enabled by the second read enable signal line 638b. Continuing with the example provided above, the second read port circuit 530b may be an active-high enable read port circuit such as the Read_Port__2 circuit 300b in FIG. 3 and include the active-high enable (en) input node implemented in a NMOS region such as the NMOS region 450 of FIG. 4.

In one aspect of the disclosed approach, in designing and manufacturing the multiport register 500, additional dual read port latches in the plurality of dual read port latches 502 may be formed on either side of the standard cell 600 and share the first read enable signal line 638a, and the second read enable signal line 638b, as well as the clock signal line 618. Thus, the circuit elements for the other dual read port latches in the plurality of dual read port latches 502 may all be created using a layout identical to the layout for the standard cell 600 described in FIG. 6. For example, the standard cell 600 may be replicated and placed end-to-end, where opposing edges of the standard cell 600 at which the read enable signal lines and clock line are located may be placed against corresponding opposing edges of the replicated standard cells with identical layouts. Although the example described herein contemplates a row of 64 latches and corresponding dual port read circuits, it should be understood that any number of latches and corresponding dual port read circuits may be coupled together in one or more rows to form arbitrarily large multiport registers. Further, although convention and the examples provided herein describe placing standard cells on an end-to-end manner such that rows are formed, there should be no reason why another orientation may not be used, such as forming the multiport latch using a column of suitably oriented copies of standard cells 600. Thus, unless otherwise noted, any reference to "rows" or "horizontal" should not be limiting as such.

In addition, even though the description makes references to specific technological manufacturing approaches and devices, any specific references are made for purposes of providing descriptions of various aspects of the disclosed approach, and not be taken to be limiting. For example, certain aspects of the disclosed approach have been described using NMOS-based and PMOS-based devices. However, one or more of these aspects may be applicable to other types of semiconductor devices, such as other forms of MOS-based devices, bipolar junction transistors, and the like. Also, the various aspects of the disclosed approach use a memory device having multiple read ports so as to avoid unnecessarily complicating the discussion. As noted above, various aspects of the disclosed approach may also be applicable to implementing a memory device having multiple write ports, or a memory device having multiple ports for simultaneous read and write operations from and to the memory device.

It should be noted that various means may be used to implement an apparatus such as the memory device described herein. For example, the memory device may be implemented using an IC element that includes means for storing data. In one aspect of the disclosed approach, the means for storing data may include a memory device such as the latch circuit 510. The IC element may also include a P-type semiconductor region having a first semiconductor means from a first memory port circuit coupled to the means for storing data. In one aspect of the disclosed approach, the first semiconductor means may include a transistor such as the transistor 304a from the Read_Port__1 circuit 300a of FIG. 3 that is configured to enable the first memory-port circuit to provide access to the means for storing data when the first semiconductor means is activated. The IC element may further include an N-type semiconductor region having a second semiconductor means from a second memory port circuit coupled to the means for storing data. In one aspect of the disclosed approach, the second semiconductor means may include a transistor such as the transistor 306b from the Read_Port__2 circuit 300b of FIG. 3 that is configured to enable the second memory-port circuit to provide access to the means for storing data when the second semiconductor means is activated. The IC element may still further include means for distributing signals over the P-type and N-type semiconductor regions of the IC element, including a first memory port selection means for activating the first semiconductor means; a second memory port selection means for activating the second semiconductor means; and a clock signal distribution means for providing timing information to the IC element, where the clock signal distribution means may be placed between the first memory port selection means and the second memory port selection means. In accordance with various aspects of the disclosed approach, the means for distributing signals over the P-type and N-type semiconductor regions of the IC element may include metal layer signal lines. Thus, for example, referring to FIG. 4, the first memory port selection means for activating the first semiconductor means may be implemented using a read enable selection line such as the Read_Sel__1 signal line 464; the second memory port selection means for activating the second semiconductor means may be implemented using another read enable selection line such as the Read_Sel__2 signal line 466; and the clock signal distribution means for providing timing information to the IC element may be implemented using a clock signal line such as the CLK signal line 462. As another example, referring to FIG. 6, the first memory port selection means for activating the first semiconductor means may be implemented using a read enable signal line such as the Read_Sel__1 signal line 638a; the second memory port selection means for activating the second semiconductor means may be implemented using another read enable signal line such as the Read_Sel__2 signal line 638b; and the clock signal distribution means for providing timing information to the IC element may be implemented using a clock signal line such as the CLK signal line 618.

Figure 7:
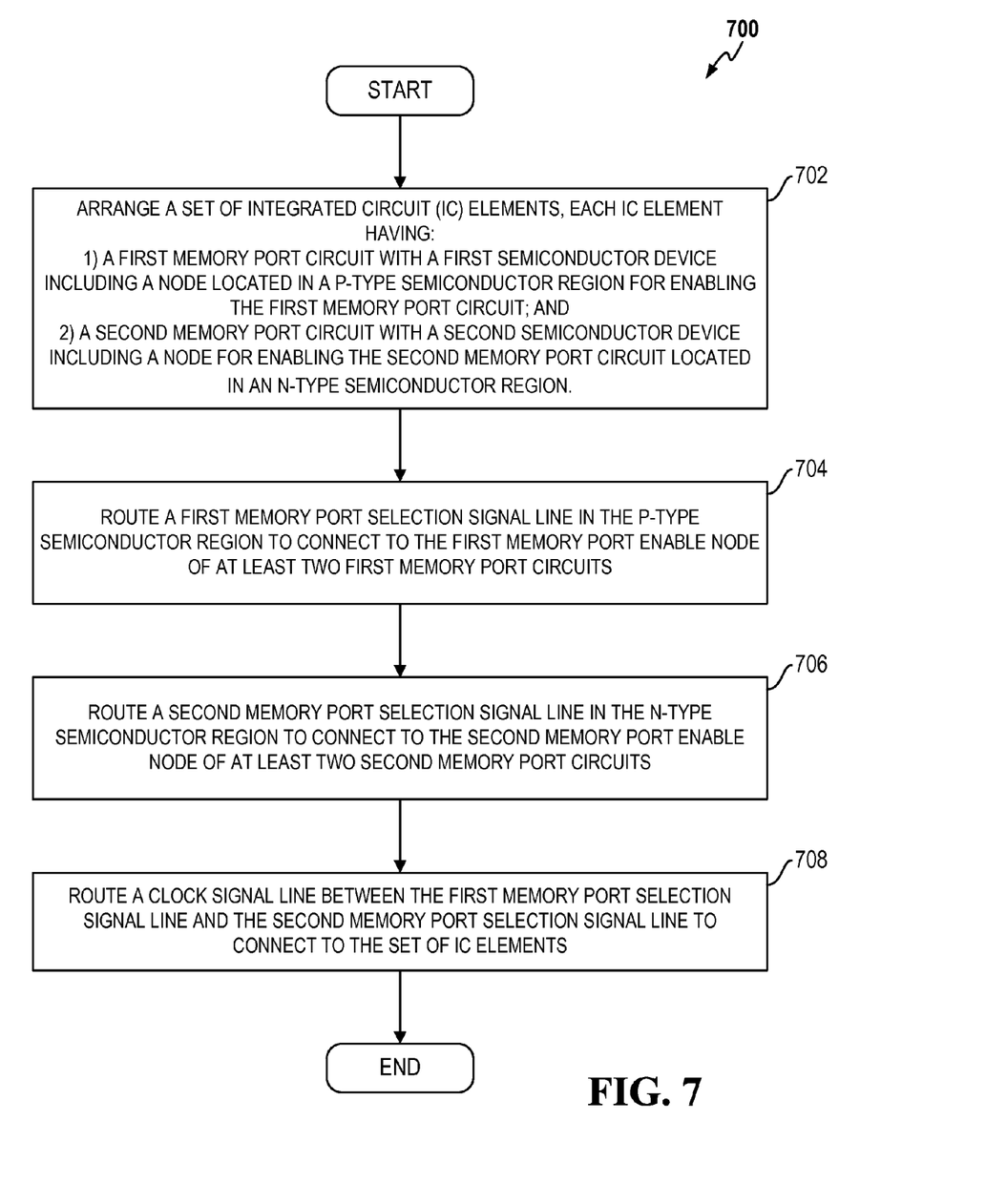
FIG. 7 is a flow chart of a signal line routing approach in a standard cell of an improved dual read port latch for implementing a multiport register configured in accordance with one aspect of a disclosed approach for reducing clock power consumption; and, FIG. 8 is a block diagram conceptually illustrating an example of a system on a chip (SoC) in which a standard cell of an improved dual read port latch for implementing a multiport register configured in accordance with one aspect of a disclosed approach for reducing clock power consumption may be used.

FIG. 7 illustrates a process 700 for using a memory apparatus such as a multiport register configured in accordance with one aspect of the disclosed approach where, at 702, a set of IC elements, each IC element including a memory device, may be arranged. For example, the memory apparatus may be the multiport register 500 and, as such, the set of IC elements may be the improved dual read port latch 502 in FIG. 5. The memory device may be a latch circuit such as the latch circuit 510. In one aspect of the disclosed approach, each IC element also includes a first memory port circuit having a first memory port enable node coupled to a first semiconductor device configured to enable access to the content of the memory device. The first memory port enable node is located in a P-type semiconductor region. Each IC element also includes a second memory port circuit including a second memory port enable node coupled to a second semiconductor device configured to enable access to the content of the memory device, wherein the second memory port enable node is located in an N-type semiconductor region. For example, the first memory port circuit may be the first memory (read) port circuit 530a, and the second memory port circuit may be the second memory (read) port circuit 530b. As the first memory (read) port circuit 530a may be implemented using the Read Port 1 circuit 300a, and the second memory (read) port circuit 530b may be implemented using the Read Port 2 circuit 300b, as discussed above, the first semiconductor device may be an active low-enable activated transistor such as the transistor 304a, and the second semiconductor device may be an active high-enable activated transistor such as the transistor 306b.

At 704, a first memory port selection signal line may be routed to connect the first memory port enable node of at least two first memory port circuits. In one aspect of the disclosed approach, the first memory port selection signal line may be routed in the P-type semiconductor region. Thus, continuing with the example above, the first memory port selection signal line may be the Read_Sel__1 signal line 464, which is coupled to the active-low enable ($\overline{en}$) input nodes of two or more first memory port circuits. Referring also to FIG. 6, the Read_Sel__1 signal line 638a may be coupled to the first read port contact 634a of the first read port portion 630a.

At 706, a second memory port selection signal line may be routed to connect the second memory port enable node of at least two second memory port circuits. In one aspect of the disclosed approach, the first memory port selection signal line may be routed in the N-type semiconductor region. Thus, continuing with the example above, the second memory port selection signal line may be the Read_Sel__2 signal line 466, which is coupled to the active-high enable (en) input nodes two or more second memory port circuits. Referring also to FIG. 6, the Read_Sel__2 signal line 638b may be coupled to the second read port contact 634b of the second read port portion 630b.

At 708, a clock signal line may be routed between the first memory port selection signal line and the second memory port selection signal line to connect to the set of IC elements. As illustrated in FIG. 4, the CLK signal line 462 may be routed between the Read_Sel__1 signal line 464 and the Read_Sel__2 signal line 466. Referring also to FIG. 6, the CLK signal line 618 is routed between the Read_Sel__1 signal line 638a and the Read_Sel__2 signal line 638b.

Figure 8:
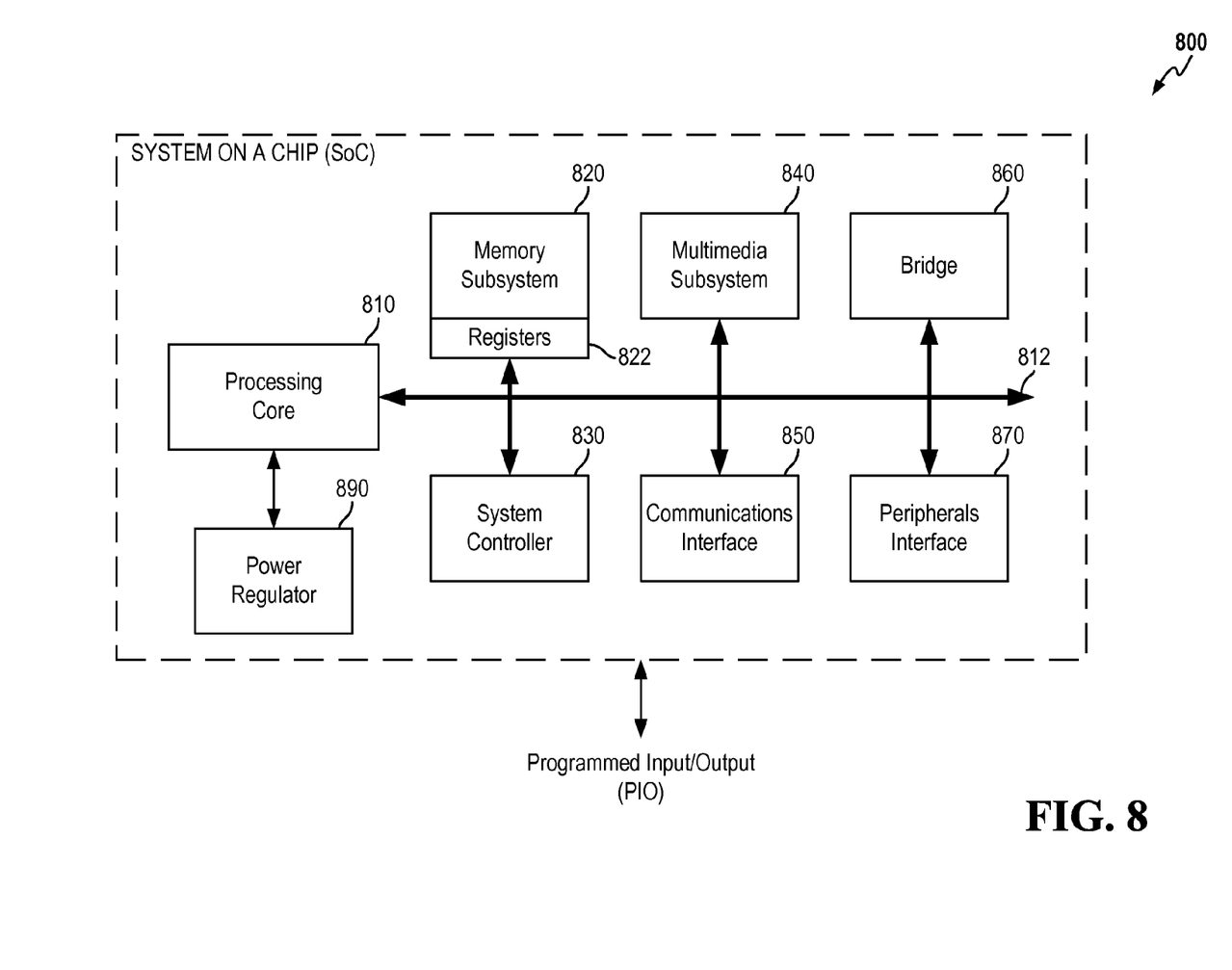

FIG. 8 illustrates a typical system on a chip (SoC) 800 in which various aspects of the disclosed approach for balanced source voltage biasing may be utilized. The SoC 800 includes a processing core 810 and a memory subsystem 820, supported by a system controller 830 and various other modules, components, and subsystems (referred to generally as subsystems) such as a multimedia subsystem 840, a communications interface 850, and a peripherals interface 870, as further described herein. A bus 812 and a bridge 860 may be included to interconnect the various subsystems in the SoC 800. Further, the SoC 800 also includes a power regulator 890 coupled to the processing core 810 to provide voltage and current regulation for the various subsystems in the SoC 800. In one aspect of the disclosed approach, the SoC 800 may be implemented in a single IC. In another aspect of the disclosed approach, the various modules and subsystems may be implemented as a system-in-package (SiP), in which a number of ICs may be enclosed in a single package, or chip carrier. Thus, the functionality described herein for SoC 800 may also be implemented using multiple ICs in the SiP, but similarly integrated into the single package.

The processing core 810 may include one or more microcontrollers, microprocessors, or digital signal processing (DSP) cores. Depending on the specific requirements for the SoC 800, the processing core 810 may also include field programmable gate arrays (FPGAs), programmable logic devices (PLDs), state machines, gated logic, discrete hardware circuits, and other suitable hardware configured to perform the various functionality described throughout this disclosure.

The system controller 830 may include modules that may be used to provide control and timing for the SoC 800. For example, the system controller 830 may include timing sources that may be used to control and provide timing necessary for operation of various modules and subsystems in the SoC 800. For example, the system controller 830 may include various timers such as real-time clocks for driving timing of operation of various logic; watchdog timers for detecting and initiating recovery from any malfunctions using modules such as a power-on reset (PoR) generators; and counter-timers. To implement these clocks and timers, the system controller 830 may include oscillators and phase-locked loop (PLL) modules.

The SoC 800 may provide display output for a display (not shown) via the multimedia subsystem 840. The multimedia subsystem 840 may include a graphics processing unit (GPU), video device drivers, and other devices used to produce graphics display information. The multimedia subsystem 840 may also provide for input of multimedia if the SoC 800 is to feature video or image capture functionality from devices such as from a camera or image sensor. In addition to imaging functionality, the multimedia subsystem 840 may also provide for audio processing for both audio input and output. In general, as used herein the multimedia subsystem 840 is an abstraction of a module that handles all multimedia functionality requested of the SoC 800. As mobile devices become more versatile, the multimedia subsystem 840 may be used to provide other functionality.

The communications interface 850 provides an interface between the SoC 800 and external communications interfaces, such as one or more transceivers. The one or more transceivers may conform to one or more communications standards, and provide a means for communicating with various other apparatus over a transmission medium. For example, an external communications interface may include a wireless transceiver with radio frequency (RF) circuitry and components to allow the SoC 800 to communicate on a mobile network. Other external communications interfaces may include transceivers for local area networks (LANs), including wireless LANs (WLANs), and metropolitan or wide area networks (WANs). MAC and PHY layer components may be implemented in the SoC 800 or in one or more communication interfaces.

The memory subsystem 820 may include a selection of memory devices. In one aspect of the disclosed approach, the memory subsystem 820, referred to generally as a computer-readable medium, may be used for storing data that is manipulated by the processing core 810 or other subsystems of the SoC 800 when executing software or algorithms that include instructions to control the operation of the processing core 810 or other subsystems of the SoC 800. These instructions, or "code," that make up the software or describe various algorithms in the software may themselves be stored in the memory subsystem 820. For example, the memory subsystem 820 may include a set of multiport registers 822 configured in accordance with various aspects of the described approach, such as in a fashion after the multiport register 500. A subsystem such as the communications interface 850 may be configured to place data from components such as MAC and PHY layer components in the set of multiport registers 822, and the data may be accessed simultaneously by another subsystem such as the processing core 810. As such, both the communications interface 850 and the processing core 810 share access to the set of multiport registers 822, and share information for packets to be transmitted or received in the communications interface 850. Although illustrated as being located in the SoC 800, conceptually the memory subsystem 820 as further described herein may include memory components that reside externally to the SoC 800, and distributed across multiple devices or entities. Some, or all, of these multiport registers may reside externally to the SoC 800, although those possessing any skill of art in this area would understand that it may certainly be more efficient for certain implementations to locate memory components such as registers close to components that may require the functions provided by these memory components most often.

The computer-readable medium may be a non-transitory computer-readable medium such as a computer-readable storage medium. Non-transitory computer-readable media may include, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register such as the multiport register configured in accordance with various aspects of the approach described herein, a removable disk, and any other suitable medium for storing software and/or instructions that may be accessed and read by a processor in a computer or in the processing core 810. The computer-readable medium may also include, by way of example, a carrier wave, a transmission line, and any other suitable medium for transmitting software and/or instructions that may be accessed and read by a processor in a computer or in the processing core 810. The computer-readable medium may be embodied in a computer program product. By way of example, the computer program product may include a computer-readable medium in packaging materials. Those skilled in the art will recognize how best to implement the described functionality presented throughout this disclosure depending on the particular application and the overall design constraints imposed on the overall system.

The SoC 800 may be implemented as having a bus architecture, represented generally by the bus 812 in FIG. 8, and include any number of interconnecting buses and bridges, such as the bridge 860, depending on the specific application of the SoC 800 and overall design constraints. The bus 812 links together the various subsystems of the SoC 800 that, as discussed, may include one or more processors (represented generally by the processing core 810), the memory subsystem 820, and various other subsystems described herein. The bus 812 may include one or more direct memory access (DMA) controllers to route data directly between the memory subsystem 820 and other subsystems, bypassing the processing core 810 and thereby increasing data throughput of the SoC. 800. For example, the multimedia subsystem 840 may include one or more GPUs, as discussed above. These GPUs, which are specialized processing devices that may be more powerful in some aspects than processing devices in the processing core 810, typically require high speed access to read and write data in the memory subsystem 820 for storing and manipulating display data, such as frame buffer data. The DMA controllers allow a GPU to directly interact with the memory subsystem 820, bypassing and avoiding the creation of any bottlenecks by its access. In this example, the memory subsystem 820 may include one or more multiport registers, such as the set of multiport registers 822, that may simultaneously be accessed by the GPU and the processing core 810.

The peripherals interface 870 may be used to support communications with peripheral devices coupled to the SoC 800 using external interfaces confirming to such industry standards as Universal Serial Bus (USB), FireWire, Universal Synchronous/Asynchronous Receiver/Transmitter (US-ART), and Serial Peripheral Interface (SPI) busses. The peripherals interface 870 may also include analog interfaces such as digital-to-analog converters (DAC) and analog-to-digital converters (ADC). These peripheral devices may be used to extend the functionality of the SoC 800.

To provide power to the SoC 800, the power regulator 890 may include voltage regulators and power management circuits that interface with power supply components such as one or more power amplifiers, batteries, and converters. In one aspect of the disclosed approach, the power regulator 890 provides power to the SoC 800 based on control information received from the processing core 810. The power regulator 890 may also receive control signals from the system controller 830. Power from the power regulator 890 may be delivered via a power delivery circuit that may include filtering functions. Further, although modern SoCs such as those used in mobile applications include a high level of integration, may designs still dictate that processing and GPU modules operate on their own independent power planes. Thus, the power regulator 890 may also support multiple power planes as necessary.

Those of ordinary skill in the art would understand that the information transmitted, stored, and/or received may be represented using any of a variety of different technologies and techniques. For example, data, instructions, commands, signals, bits, symbols, and chips referenced throughout this description may be represented by voltages, currents, electromagnetic waves, magnetic fields or particles, optical fields or particles, or any combination thereof. Some drawings may illustrate signals as a single signal for clarity of presentation and description. However, it should be understood by those of ordinary skill in the art that the signal may represent several signals, such as those travelling over a signal bus, wherein the signal bus may have a variety of bit widths and the disclosed approach may be implemented using any number of data signals, including a single data signal. For the most part, details concerning timing considerations and the like have been omitted where such details are not necessary to obtain a complete understanding of the disclosed approach, especially by one of ordinary skill in the art.

Those of ordinary skill in the art would appreciate that any of elements described in connection with the various aspects of the disclosed approach may be implemented as electronic hardware (e.g., a digital implementation, an analog implementation, or a combination of the two, which may be designed using source coding or some other technique); various forms of program or design code incorporating instructions, which may be referred to herein, for convenience, as "software" or a "software module"; or combinations of both. To better illustrate this interchangeability of hardware and software, the various illustrative elements have been described above generally in terms of their functionality. Whether such functionality is implemented as hardware or software depends upon the particular application and design constraints imposed on the overall system. Thus, those of ordinary skill in the art may implement the described functionality in varying ways for each particular application, and such implementation decisions should not be interpreted as causing a departure from the spirit of the disclosed approach.

Where any of the elements described herein is implemented as electronic hardware, it may be implemented as either an IC or a part of an IC. The IC may include a general purpose processor, a DSP, an ASIC, an FPGA or other programmable logic device, discrete gate or transistor logic, discrete hardware component, electrical component, optical component, mechanical component, or any combination thereof designed to perform the functions described herein. The general purpose processor may include a microprocessor or, in the alternative, the general purpose processor may be any conventional processor, controller, microcontroller, or state machine. In general, the IC may be configured as a combination of a variety of computing devices described herein, such as a combination of: a DSP and a microprocessor; a number of microprocessors; multiple microprocessors in conjunction with multiple DSPs; or any other such configuration.

To the extent any of the elements described herein is implemented as software that includes algorithmic codes or instructions, those of ordinary skill in the art would appreciate that the various electronic hardware described herein may be configured to operate using said software. For example, an IC may be configured to execute software that reside within the IC, outside of the IC, or both. As another, more specific example, an IC may implement a general purpose processor configured for executing software to perform the functions and operations described herein. As such, those of ordinary skill in the art should understand that any specific order or hierarchy of steps in any disclosed software operation executed by the general purpose processor is an example of a sample approach. Based upon design preferences, it may be preferable to utilize a special purpose processor to carry out various aspects of the disclosed approach. The accompanying method claims thus may include elements of the various steps in a sample order, and are not meant to be limited to the specific order or hierarchy presented unless otherwise stated.

The steps of a method or algorithm described in connection with the various aspects of the disclosed approach may be embodied directly in hardware, in a software module executed by a processor, or in a combination of the two. A software module (e.g., including executable instructions and related data), and other data may reside in a data memory such as RAM memory, flash memory, ROM memory, EPROM memory, EEPROM memory, a register such as the multi-port register configured in accordance with various aspects of the approach described herein, a hard disk, a removable disk, a CD-ROM, or any other form of computer-readable storage medium known in the art. A sample storage medium may be coupled to a machine such as, for example, a computer/processor (which is referred to herein, for convenience, as a "processor") such that the processor can both read information (e.g., code) from, and write information to, the storage medium. A sample storage medium may be integral to the processor. The processor and the storage medium may reside in an ASIC. The ASIC may reside in user equipment. In the alternative, the processor and the storage medium may reside as discrete components in user equipment. Moreover, in some aspects any suitable computer-program product may comprise a computer-readable medium comprising codes (e.g., executable by at least one computer) relating to one or more of the aspects of the disclosure. In some aspects a computer program product may comprise packaging materials.

It should be understood that any references that has been made to elements using a designation such as "first," "second," "third," and so forth should not limit a quantity and/or order of those elements, unless any such limitation has been explicitly stated. Rather, these designations should be understood, as convention dictates, to distinguish between two or more elements and/or instances of an element. Thus, a reference to "first and second elements" does not mean that only two elements may be employed nor that the "first element" must precede the "second element" in some manner. In addition, unless stated otherwise, any reference to a "set of elements" should be understood to mean a collection of elements, which may mean an "empty set" where the collection includes zero elements.

The previous description is provided to enable any person skilled in the art to fully understand the full scope of the disclosure. Modifications to any configuration disclosed herein that remains in the spirit of the disclosed approach should be readily apparent to those of ordinary skill in the art. Thus, the claims are not intended to be limited to the specifics of the various aspects of the disclosure described herein, but are to be accorded the full scope consistent with the language of claims, wherein reference to an element in the singular is not intended to mean "one and only one" unless specifically so stated, but rather "one or more." Unless specifically stated otherwise, the term "some" refers to one or more. A claim that recites at least one of a combination of elements (e.g., "at least one of A, B, or C") refers to one or more of the recited elements (e.g., A, or B, or C, or any combination thereof). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. An apparatus comprising:
 an integrated circuit (IC) element comprising:
  a memory device;
  a P-type semiconductor region comprising a first semiconductor device from a first memory port circuit coupled to the memory device, the first semiconductor device configured to enable the first memory port circuit to provide access to the memory device when the first semiconductor device is activated;
  an N-type semiconductor region comprising a second semiconductor device from a second memory port circuit coupled to the memory device, the second semiconductor device configured to enable the second memory port circuit to provide access to the memory device when the second semiconductor device is activated; and,
  a plurality of signal lines distributed over the P-type and N-type semiconductor regions comprising:
   a first memory port selection line coupled to allow the first semiconductor device to be activated;
   a second memory port selection line coupled to allow the second semiconductor device to be activated; and, a clock signal line placed between the first memory port selection line and the second memory port selection line.

2. The apparatus of claim 1, wherein:
the memory device comprises a multiport memory circuit;
the first semiconductor device comprises a first read enable input such that the first memory port circuit is configured as a first read multiplexer (MUX) circuit comprising an active-low enable read function; and,
the second semiconductor device comprises a second read enable input such that the second memory port circuit is configured as a second read MUX circuit comprising an active-high enable read function.

3. The apparatus of claim 1, wherein the P-type semiconductor region comprises a PMOS region with a majority charge carrier comprising predominantly hole carriers.

4. The apparatus of claim 1, wherein the N-type semiconductor region comprises an NMOS region with a majority charge carrier comprising predominantly electron carriers.

5. The apparatus of claim 1, wherein the memory device comprises a semiconductor memory device coupled to the first memory port circuit and the second memory port circuit, wherein the first memory port circuit and the second memory port circuit are configured to output information stored in the semiconductor memory device.

6. The apparatus of claim 5, wherein the semiconductor memory device comprises at least one latch device configured with multiple ports to allow simultaneous read or write operations.

7. The apparatus of claim 1, further comprising a second IC element comprising a layout identical to the IC element, where the second IC element comprises a corresponding pair of memory port selection lines configured to align with locations of the first memory port selection line and the second memory port selection line when a corresponding edge of the second IC element is placed next to an edge of the IC element.

8. The apparatus of claim 7, wherein the layout of the IC element is configured to allow placement of multiple IC elements comprising the layout identical to the IC element in an end-to-end configuration such that the memory port selection lines of each particular IC are coupled to each other.

9. The apparatus of claim 7, wherein the IC element comprises two opposing edges and the layout of the IC element comprises a placement of the first memory port selection line and the second memory port selection line to allow an alignment of the pair of corresponding memory port selection lines from the second IC element when opposing edges of the IC element and the second IC element are placed against each other.

10. The apparatus of claim 1, wherein the first and second memory port selection lines are separately routed in the P-type and N-type semiconductor regions, respectively.

11. An apparatus comprising:
an integrated circuit (IC) element comprising:
means for storing data;
a P-type semiconductor region comprising a first semiconductor means from a first memory port circuit coupled to the means for storing data, the first semiconductor means configured to enable the first memory port circuit to provide access to the means for storing data when the first semiconductor means is activated;
an N-type semiconductor region comprising a second semiconductor means from a second memory port circuit coupled to the means for storing data, the second semiconductor means configured to enable the second memory port circuit to provide access to the means for storing data when the second semiconductor means is activated; and
means for distributing signals over the P-type and N-type semiconductor regions of the IC element comprising:
a first memory port selection means for activating the first semiconductor means;
a second memory port selection means for activating the second semiconductor means; and
a clock signal distribution means for providing timing information to the IC element, the clock signal distribution means being placed between the first memory port selection means and the second memory port selection means.

12. The apparatus of claim 11, wherein:
the means for storing data comprises means for multiple read access to data stored in the means for storing data;
the first semiconductor means comprises means for receiving a first read enable signal from a first read multiplexer (MUX) circuit comprising an active-low enable read function; and
the second semiconductor means comprises means for receiving a second read enable signal from a second read MUX circuit comprising an active-high enable read function.

13. The apparatus of claim 11, wherein the P-type semiconductor region comprises a PMOS region with a majority charge carrier comprising predominantly hole carriers.

14. The apparatus of claim 11, wherein the N-type semiconductor region comprises an NMOS region with a majority charge carrier comprising predominantly electron carriers.

15. The apparatus of claim 11, wherein the means for storing data further comprising semiconductor memory means for storing information, the semiconductor memory means being coupled to the first semiconductor means and the second semiconductor means, wherein the first memory port circuit and the second memory port circuit comprise means for outputting the information stored in the semiconductor memory means.

16. The apparatus of claim 15, wherein the semiconductor memory means for storing the information comprises at least one latch device configured with multiple ports to allow simultaneous read or write operations.

17. The apparatus of claim 11, further comprising a second IC element comprising a layout identical to the IC element, where the second IC element comprises a corresponding pair of memory port selection means configured to align with locations of the first memory port selection means and the second memory port selection means when a corresponding edge of the second IC element is placed next to an edge of the IC element.

18. The apparatus of claim 17, wherein the layout of the IC element is configured to allow placement of multiple IC elements comprising the layout identical to the IC element in an end-to-end configuration such that the corresponding pair of memory port selection means of each particular IC element are coupled to each other.

19. The apparatus of claim 17, wherein the IC element comprises two opposing edges and the layout of the IC element comprises a placement of the first memory port selection means and the second memory port selection means to allow an alignment of the pair of corresponding memory port selection means from the second IC element when opposing edges of the IC element and the second IC element are placed against each other.

20. The apparatus of claim 11, wherein the first and second memory port selection means are separately routed in the P-type and N-type semiconductor regions, respectively.

21. A method for forming a memory apparatus comprising:
arranging a set of integrated circuit (IC) elements, each IC element comprising a memory device comprising:
- a first memory port circuit comprising a first memory port enable node coupled to a first semiconductor device configured to enable access to the memory device, wherein the first memory port enable node is located in a P-type semiconductor region; and,
- a second memory port circuit comprising a second memory port enable node coupled to a second semiconductor device configured to enable access to the memory device, wherein the second memory port enable node is located in an N-type semiconductor region;

routing a first memory port selection signal line in the P-type semiconductor region to connect to the first memory port enable node of at least two first memory port circuits;

routing a second memory port selection signal line in the N-type semiconductor region to connect to the second memory port enable node of at least two second memory port circuits; and, routing a clock signal line between the first memory port selection signal line and the second memory port selection signal line to connect to the set of IC elements.

22. The method of claim 21, wherein:
the memory device comprises a multiport memory circuit;
the first memory port enable node comprises a first read enable input such that the first memory port circuit is configured as a first read multiplexer (MUX) circuit comprising an active-low enable read function; and
the second memory port enable node comprises a second read enable input such that the second memory port circuit is configured as a second read MUX circuit comprising an active-high enable read function.

23. The method of claim 21, wherein the memory device comprises a semiconductor memory device coupled to the first memory port circuit and the second memory port circuit, wherein the first memory port circuit and the second memory port circuit are configured to output information stored in the semiconductor memory device.

24. The method of claim 23, wherein the semiconductor memory device comprises at least one latch device configured with multiple ports to allow simultaneous read or write operations.

25. The method of claim 21, wherein each IC element in the set of IC elements comprise an identical layout such that a corresponding pair of memory port selection signal lines from any other IC element is configured to align with locations of the first memory port selection signal line and the second memory port selection signal line when a corresponding edge of the second IC element is placed next to an edge of the IC element.

26. The method of claim 25, wherein the layout of each IC element is configured to allow placement of multiple IC elements comprising the identical layout in an end-to-end configuration such that the corresponding pair of memory port selection signal lines of each particular IC element are coupled to each other.

27. The method of claim 25, wherein each IC element comprises two opposing edges and the layout of the IC element comprises a placement of the first memory port selection signal line and the second memory port selection signal line to allow an alignment of the corresponding pair of memory port selection signal lines from the second IC element when opposing edges of the IC element and the second IC element are placed against each other.

28. The method of claim 21, wherein the first and second memory port selection signal lines are separately routed in the P-type and N-type semiconductor regions, respectively.

* * * * *